United States Patent [19]

Ohri et al.

[11] Patent Number: 5,245,230
[45] Date of Patent: Sep. 14, 1993

[54] LOW SUBSTRATE INJECTION N-CHANNEL OUTPUT STAGE

[76] Inventors: Kul B. Ohri, 1539 E. Spinnaker Ct., Boise, Id. 83706; Wen-Foo Chern, 6243 Twin Oaks Dr., #1218, Colorado Springs, Colo. 80918

[21] Appl. No.: 846,896

[22] Filed: Mar. 6, 1992

[51] Int. Cl.[5] ............... H03K 17/687; H03K 3/29
[52] U.S. Cl. .................... 307/572; 307/246; 307/289; 307/296.4; 307/296.5; 307/473; 307/571; 307/577
[58] Field of Search .............. 307/473, 254, 296.1, 307/296.4, 296.5, 246, 571, 572, 584, 577, 289, 573, 575, 634, 364

[56] References Cited

U.S. PATENT DOCUMENTS

| | | | |
|---|---|---|---|
| 4,329,600 | 5/1982 | Stewart | 307/571 |
| 4,360,744 | 11/1982 | Taylor | 307/254 |
| 4,488,068 | 12/1984 | Janutka | 307/570 |
| 4,751,410 | 6/1988 | Tanizawa | 307/572 |
| 4,782,250 | 11/1988 | Adams et al. | 307/473 |
| 4,855,623 | 8/1989 | Flaherty | 307/491 |
| 4,876,465 | 10/1989 | Podkowa et al. | 307/443 |
| 4,877,978 | 10/1989 | Platt | 307/473 |
| 4,988,888 | 1/1991 | Hirose et al. | 307/473 |
| 4,996,446 | 2/1991 | Nakada | 307/296.2 |
| 5,001,369 | 3/1991 | Lee | 307/473 |
| 5,006,732 | 4/1991 | Nakamura | 307/473 |
| 5,013,940 | 5/1991 | Ansel | 307/473 |
| 5,038,056 | 8/1991 | Koide et al. | 307/473 |
| 5,057,712 | 10/1991 | Trinh et al. | 307/242 |
| 5,087,840 | 2/1992 | Davies et al. | 307/473 |

FOREIGN PATENT DOCUMENTS 0350219  1/1990  European Pat. Off. ........... 307/289

*Primary Examiner*—William L. Sikes
*Assistant Examiner*—Terry D. Cunningham

[57] ABSTRACT

An N-channel output stage having low substrate current injection during a standby mode includes a first transistor having a drain coupled to a source of supply voltage and a second transistor having a drain coupled to the source of the first transistor and a source for driving a load in a normal operating mode. A pair of multiplexers are respectively coupled to the gate of the first and second transistors. The multiplexers turn on the first transistor and couple an input signal to the gate of the second transistor in the normal operating mode, and couple a predetermined bias voltage to the gate of the first transistor and turn off the second transistor in a standby mode. The value of the bias voltage is selected to be approximately equal to $VTOTAL/2 + VT$, wherein VTOTAL is equal to the total voltage across the output stage in the standby mode and VT is an N-channel threshold voltage. The voltage across either the first or second transistors is equal and reduced to $VTOTAL/2$, thus reducing injected substrate current.

14 Claims, 3 Drawing Sheets

LOW SUBSTRATE INJECTION N-CHANNEL OUTPUT STAGE

BACKGROUND OF THE INVENTION

This invention relates generally to an N-channel output stage and more particularly to an N-channel output stage having a standby mode in which the current injected into the substrate is minimized.

In a field-effect transistor that is turned off, an undesirable current component can be injected into the substrate if a large enough voltage is developed across the device (measured between the drain and the source, i.e. $V_{DS}$). In electronic physics, this phenomenon is referred to as channel impact ionization or simply "hot-electron" injection. Generally speaking, the amount of injected substrate current increases rapidly as $V_{DS}$ is increased. The injected substrate current is undesirable since the voltage of the substrate is locally changed, which in turn may de-bias or otherwise affect the performance of adjacent transistors on an integrated circuit. In addition, on board charge pumps, which maintain a constant substrate voltage, consume excess power through increased cycling necessary to remove the additional charge caused by the injected current.

The problem of injected substrate current for a transistor that is turned off is typically found in an N-channel output stage. The most common form of an N-channel output stage is simply a single N-channel field-effect transistor, wherein the gate receives an input signal, the drain is coupled to the VDD power supply (typically five volts), and the source is coupled to the load. During normal operation the input signal gates current through the output stage to the load. During a standby mode, however, the gate is typically connected to ground to turn the transistor off. In the standby mode, a voltage even greater than the power supply voltage, typically VDD plus a transistor threshold voltage VT, can appear directly across the non-conducting transistor. Although the voltage level at the load is normally at or above ground, it may go below ground due to ringing whenever other circuitry coupled to the load is switched to ground. In the standby mode, therefore, an operating condition can exist wherein the transistor is capable of injecting a significant amount of undesirable current into the substrate of the integrated circuit.

A prior art attempt to minimize the injected substrate current is shown in the schematic diagram of FIG. 1. N-channel output stage 10 includes first and second series-connected field-effect transistors Q1 and Q2. The drain of transistor Q1 is coupled to the power supply VDD at terminal 12, and the source of transistor Q2 is coupled to the output terminal 14. The output terminal 14 is typically coupled to a load impedance. A multiplexer 24 switches the gate of transistor Q2 between an input signal at terminal 16 in a normal operating mode and ground at terminal 18 in a standby operating mode under the command of the standby signal at terminal 22. The addition of transistor Q1 in output stage 10 lowers the voltage across transistor Q2 in the standby mode. Note that the gate and drain of transistor Q1 are coupled together. Therefore the voltage across transistor Q1 is approximately equal to VT, and the voltage across transistor Q2 is lowered by VT. This is true in both the standby and normal operating modes. In the standby mode, leakage current is sufficient to establish the threshold voltage VT across transistor Q1. While the addition of transistor Q1 in output stage 10 reduces the injected substrate current during the standby mode, a significant amount of current is still injected due to the relatively high voltage across transistor Q2.

Therefore, what is desired is an N-channel output stage in which the injected substrate current during the standby mode is minimized to the greatest extent possible.

SUMMARY OF THE INVENTION

It is, therefore, an object of the invention to provide an N-channel output stage having a standby mode with minimum injected substrate current.

According to the present invention, an N-channel output stage having low substrate current injection during a standby mode includes a first transistor having a drain coupled to a source of supply voltage and a second transistor having a drain coupled to the source of the first transistor and a source for driving a load in a normal operating mode. A pair of multiplexers are respectively coupled to the gate of the first and second transistors. The multiplexers turn on the first transistor and couple an input signal to the gate of the second transistor in the normal operating mode, and couple a predetermined bias voltage to the gate of the first transistor and turn off the second transistor in a standby mode. The value of the bias voltage is selected to be approximately equal to VTOTAL/2 +VT, wherein VTOTAL is equal to the total voltage across the output stage in the standby mode and VT is an N-channel threshold voltage.

In this manner, the voltage across each of the first and second transistors is approximately equal to VTOTAL/2, thereby reducing the injected current from transistors Q1 and Q2. Operation in the normal operating mode is not affected. For further reduction in injected substrate current, a plurality of series-connected transistors and corresponding multiplexers can configured to further reduce the voltage across the transistors.

The foregoing and other objects, features and advantages of the invention will become more readily apparent from the following detailed description of a preferred embodiment of the invention which proceeds with reference to the accompanying drawings.

DETAILED DESCRIPTION

Figure 1:
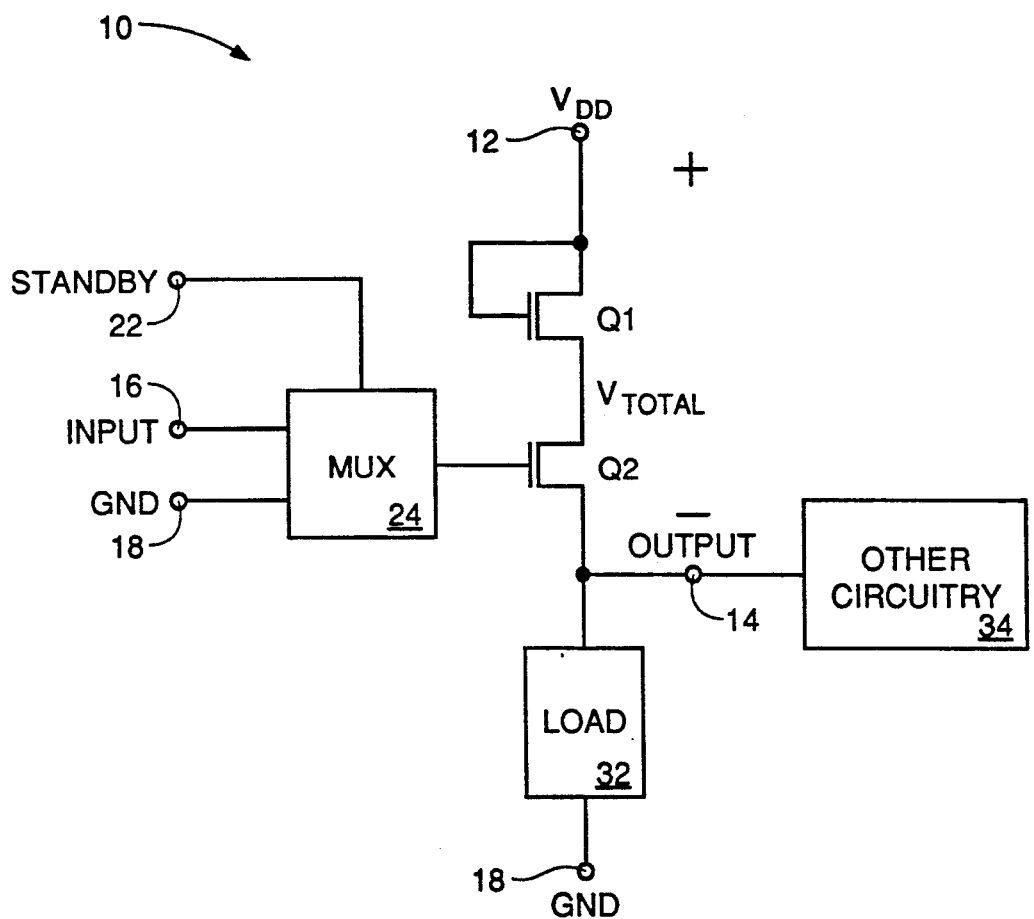
FIG. 1 is a schematic diagram of a prior art N-channel output stage.
Figure 2:
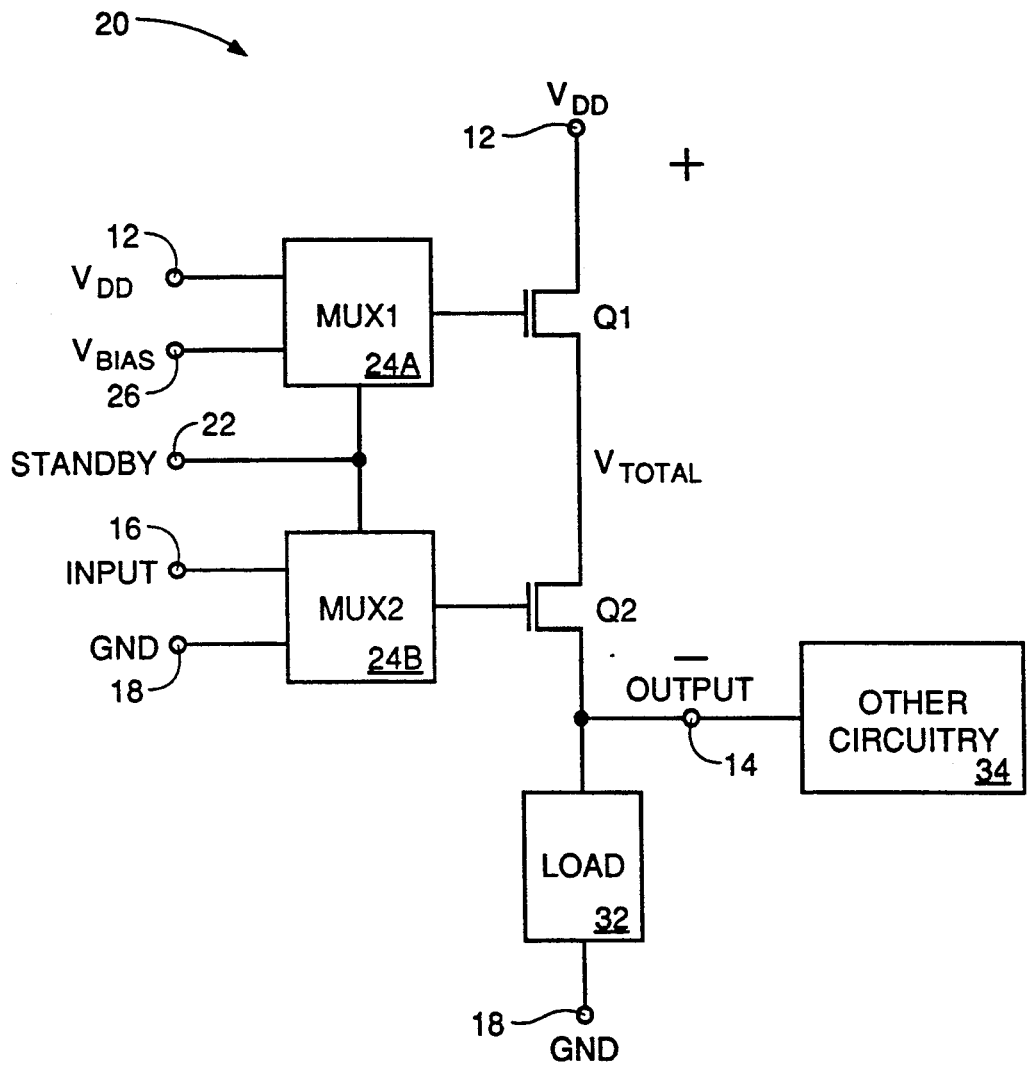
FIG. 2 is a schematic diagram of an N-channel output stage according to the present invention.

An N-channel output stage 20 having low substrate current injection during a standby mode is shown in FIG. 2. The series-connected transistors Q1 and Q2 provide a current path from the power supply terminal 12 to the output terminal 14 as in output stage 10, with the important exception that gate of transistor Q1 is not coupled to the drain. Instead, the gates of transistors Q1 and Q2 are respectively coupled to the outputs of multiplexers 24A and 24B.

The first multiplexer 24A has a first input for receiving the supply voltage VDD, a second input for receiving a predetermined bias voltage VBIAS at terminal 26, a select input for receiving a standby mode signal STANDBY at terminal 22, and an output coupled to the gate of the first transistor Q1. A second multiplexer 24B has a first input for receiving the input signal INPUT, a second input for receiving a voltage GND sufficient to turn off the second transistor such as ground, a select input for receiving the standby mode signal, and an output coupled to the gate of the second transistor Q2. Therefore, the multiplexers 24A and 24B turn on the first transistor Q1 and couple the input signal to the gate of the second transistor Q2 in the normal operating mode, wherein the current flows from the power supply through the transistors and into the load. In the standby mode, the multiplexers 24A and 24B couple the predetermined bias voltage to the gate of the first transistor Q1 and turn off the second transistor Q2 to prevent current flowing into the load.

The value of the bias voltage VBIAS for the output stage 20 is selected to be less than the value of the supply voltage VDD and greater than zero volts. A more precise value of the bias voltage is approximately VTOTAL/2 +VT, Wherein VTOTAL is equal to the total voltage across the output stage between terminals 12 and 14 in the standby mode, and VT is the threshold voltage of the first transistor Q1. The voltage across each of the transistors is approximately equal to VTOTAL/2, once the threshold voltage of transistor Q1 is subtracted. Due to the current-voltage characteristics of substrate current injection, it is desirable that the voltage on each device be made equal and as small as possible. The injected substrate current diminishes rapidly, and nonlinearly, as drain-to-source voltage is reduced.

Figure 3:
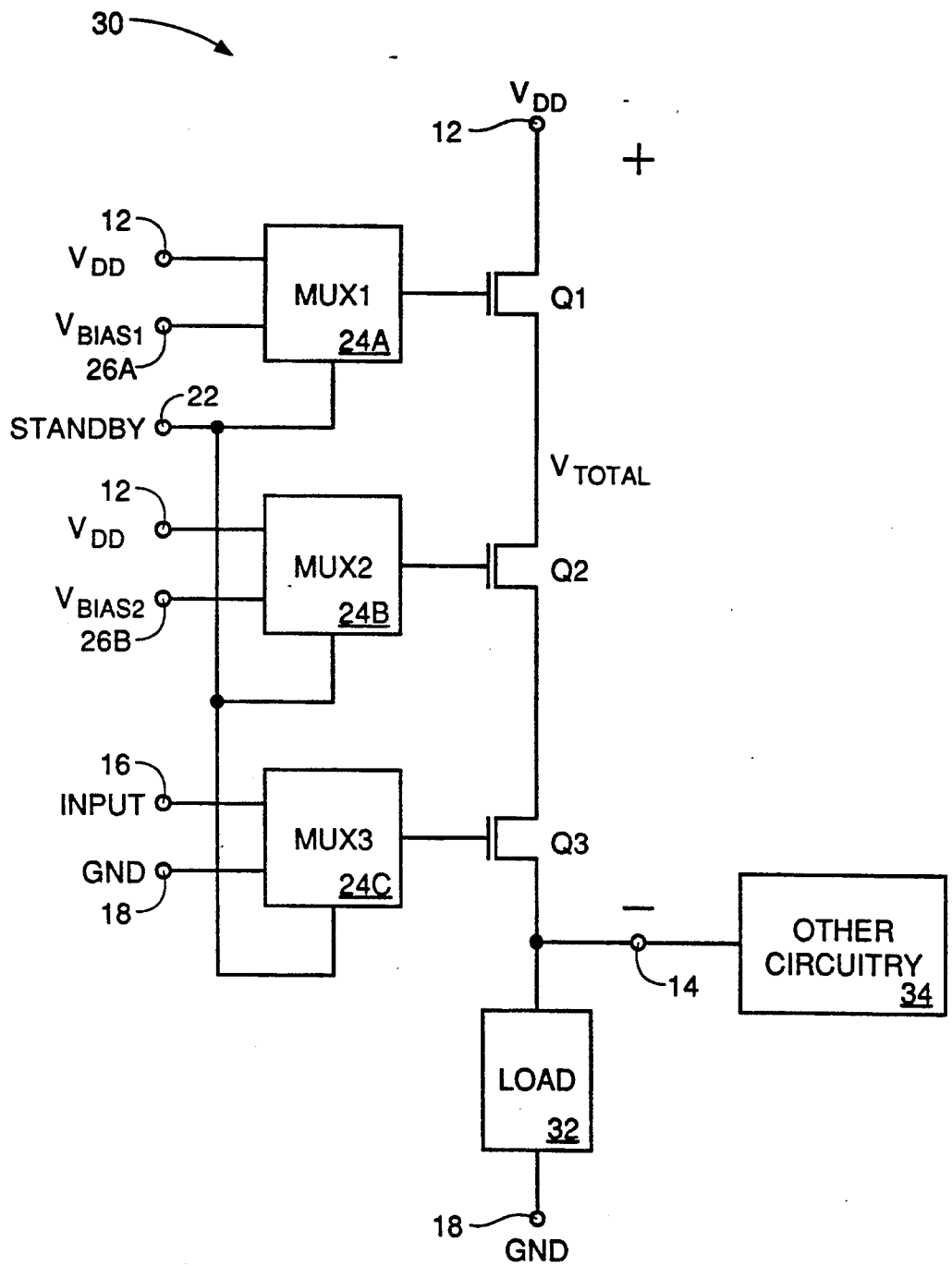
FIG. 3 is a schematic diagram of an alternative embodiment of the N-channel output stage of the present invention.

For maximum reduction of injected substrate current, the number of transistors in the output stage and multiplexers can be increased. The voltage across each transistor necessarily decreases as the number of transistors is increased, thus further reducing the injected substrate current. An N-channel output stage 30 including three transistors and three corresponding multiplexers is shown in FIG. 3. Output stage 30 includes three series-connected transistors Q1, Q2, and Q3, wherein the drain of transistor Q1 is coupled to the VDD supply voltage at terminal 12 and the source of transistor Q3 drives a load in the normal operating mode at terminal 14.

Multiplexer 24C has two inputs for receiving the input and ground signals, a select input for receiving the standby mode signal, and an output coupled to the gate of transistor Q3. The operation of multiplexer 24C is identical to that of multiplexer 24B in FIG. 2. The "last" multiplexer in the series of multiplexers either gates the input signal to control the current flow through transistor Q3 in the normal operating mode, or turns off transistor Q3 in the standby mode.

A pair of multiplexers 24A and 24B each have a first input for receiving the supply voltage VDD, a second input for receiving one of the bias voltages VBIAS1 or VBIAS2 at terminals 26A or 26B, a select input for receiving a standby mode signal, and an output respectively coupled to the gate transistors Q1 or Q2. In operation, multiplexers 24A and 24B either turn on transistors Q1 and Q2 in the normal operating mode, or serve to maintain an equal voltage across each transistor Q1–Q3 in the output stage to minimize injected substrate current in the standby mode.

The values of the bias voltages VBIAS1 and VBIAS2 are carefully selected to maintain the desired voltages across each of the transistors in the output stage 30. The value of the first bias voltage, VBIAS1, is selected to be approximately equal to $(\frac{2}{3})$VTOTAL+VT. The value of the second bias voltage, VBIAS2, is selected to be approximately equal to VTOTAL/3+VT. Again, VTOTAL is the total voltage measured across terminals 12 and 14 in the standby mode, and VT is the threshold voltage of the transistors used in the output stage 30. Since the threshold voltage is subtracted, the drain-to-source voltage on each transistor in the output stage is approximately VTOTAL/3.

It is appreciated by those skilled in the art that the output stage 30 shown in FIG. 3 can be reconfigured to include any number of multiplexer and transistor stages that are required to reduce the injected substrate current below a desired level. If N multiplexers and N transistors are used, the value of the first bias voltage VBIAS1 (most positive and associated with the first transistor coupled to the VDD power supply) is selected to be approximately equal to $((N-1)/N)$VTOTAL+VT and the value of a second bias voltage VBIAS2 is selected to be approximately equal to $((N-2)/N)$VTOTAL+VT. The values of bias voltage are linearly decreased until the value of the last bias voltage VBIASN is approximately equal to VTOTAL/N+VT.

The values given above for the bias voltages are approximate, since the performance of the transistors in the output stage can vary widely with the type of semiconductor process used, the size of the transistors, voltage and current operating conditions and temperature. These values, however, are at least first order approximations to the optimum value, and may be entirely sufficient for most applications. If maximum reduction of injected substrate current is desired, it is advisable that, using the above bias voltage values as a starting point, the exact value of the bias voltages be optimized with computer simulations or measuring test circuits.

Having described and illustrated the principles of the invention in a preferred embodiment thereof, it is apparent to those skilled in the art that the invention can be modified in arrangement and detail without departing from such principles. We therefore claim all modifications and variation coming within the spirit and scope of the following claims.

We claim:

1. An N-channel output stage having low substrate current injection during a standby mode comprising:
   a first transistor having a drain coupled to a source of supply voltage, a gate, and a source;
   a second transistor having a drain coupled to the source of the first transistor, a gate, and a source for driving a load in a normal operating mode; and
   means coupled to the gates of the first and second transistors for turning on the first transistor and coupling an input signal to the gate of the second transistor in the normal operating mode, and for coupling a predetermined bias voltage to the gate of the first transistor and coupling a second voltage that is different than the predetermined bias voltage to the gate of the second transistor for turning off the second transistor in the standby mode.

2. An N-channel output stage as in claim 1 in which the means coupled to the gate of the first and second transistors comprises:
   a first multiplexer having a first input for receiving the supply voltage, a second input for receiving the bias voltage, a selected input for receiving a standby mode signal, and an output coupled to the gate of the first transistor; and a second multiplexer having a first input for receiving the input signal, a second input for receiving a voltage sufficient to turn off the second transistor, a select input for receiving the standby mode signal, and an output coupled to the gate of the second transistor.

3. An N-channel output stage as in claim 1 in which the value of the bias voltage is less than the value of the supply voltage and greater than zero volts.

4. An N-channel output stage as in claim 1 in which the value of the bias voltage is approximately equal to VTOTAL/2+VT, wherein VTOTAL is equal to the total voltage across the output stage in the standby mode and VT is the threshold voltage of the first transistor.

5. A method for minimizing the injected substrate current of an N-channel output stage during a standby mode, the method comprising the steps of:
providing an N-channel output stage having first and second series connected transistors, a first current terminal coupled to a drain of the first transistor for receiving a supply voltage, a second current terminal coupled to a source of the second transistor for driving a load in a normal operating mode, and first and second inputs respectively coupled to a respective gate of the first and second transistors;
switching the second input from an input signal in the normal operating mode to a shut-off voltage sufficient to turn off the second transistor in the standby mode; and
simultaneously switching the first input from the source of power supply voltage in the normal operating mode to a bias voltage that is different than the shut-off voltage in the standby mode.

6. The method of claim 5 further comprising the step of selecting the value of the bias voltage to be less than the value of the supply voltage and greater than zero volts.

7. The method of claim 5 further comprising the step of selecting the value of the bias voltage to be approximately equal to VTOTAL/2+VT, wherein VTOTAL is equal to the total voltage across the output stage in the standby mode and VT is the threshold voltage of the first transistor.

8. An N-channel output stage having low substrate current injection during a standby mode comprising:
a plurality of series-connected transistors each having a drain, a gate, and a source, wherein the drain of a first transistor is coupled to a source of supply voltage and the source of a last transistor drives a load in a normal operating mode; and
means coupled to the gates of the transistors for coupling an input signal to the gate of the last transistor and for turning on the other transistors in the output stage in the normal operating mode, and for turning off the last transistor and for coupling respective predetermined bias voltages to each gate of the other transistors in the output stage in the standby mode.

9. An N-channel output stage as in claim 8 in which the means coupled to the gates of the transistors comprises:

a last multiplexer having a first input for receiving the input signal, a second input for receiving a voltage sufficient to turn off the last transistor, a select input for receiving a standby mode signal, and an output coupled to the gate of the last transistor; and
a plurality of multiplexers each having a first input for receiving the supply voltage, a second input for receiving a respective one of the predetermined bias voltages, a select input for receiving the standby mode signal, and an output respectively coupled to the gate of one of the remaining transistors in the output stage.

10. An N-channel output stage as in claim 8 in which the value of the predetermined bias voltages are each less than the value of the supply voltage.

11. An N-channel output stage as in claim 8 in which the value of a first one of the predetermined bias voltages is approximately equal to ((N−1)/N)VTOTAL+VT, the value of a second one of the bias voltages is approximately equal to (N=2)/N)VTOTAL+VT, the values linearly decreased until the value of a least one of the predetermined bias voltages is approximately equal to VTOTAL/N+VT, wherein VTOTAL is equal to the total voltage across the output stage in the standby mode and VT is the threshold voltage of the transistors in the output stage, and N is equal to the total number of transistors in the output stage.

12. A method for minimizing the injected substrate current of an N-channel output stage during a standby mode, the method comprising the steps of:
providing an N-channel output stage having a plurality of transistors connected in series between a first current terminal and a second current terminal, the first current terminal coupled to a source of supply voltage and a drain of a first transistor, the second current terminal coupled to a source of a last transistor for driving a load in a normal operating mode, and a plurality of inputs respectively coupled to gates of each of the transistors;
switching a last input from an input signal in the normal operating mode to a voltage sufficient to turn off the last transistor in a standby mode; and simultaneously
switching the remaining inputs from the source of power supply voltage in the normal operating mode to one of a plurality of predetermined bias voltages in the standby mode.

13. The method of claim 12 further comprising the step of selecting the value of the bias voltages to be less than the value of the supply voltage.

14. The method of claim 12 further comprising the step of selecting the value of a first bias voltage to be approximately equal to ((N−1)/N)VTOTAL+VT, the value of a second bias voltage to be approximately equal to (N−2)/N)VTOTAL+VT, the values linearly decreased until the value of the last bias voltage is selected to be approximately equal to VTOTAL/N+VT, wherein VTOTAL is equal to the total voltage across the output stage in the standby mode and VT is the threshold voltage of the transistors in the output stage, and N is equal to the total number of transistors in the output stage.

* * * * *